United States Patent
Kozawa et al.

(10) Patent No.: US 8,980,535 B2
(45) Date of Patent: Mar. 17, 2015

(54) RESIST PATTERN IMPROVING MATERIAL, METHOD FOR FORMING RESIST PATTERN, AND METHOD FOR PRODUCING SEMICONDUCTOR DEVICE

(75) Inventors: Miwa Kozawa, Kawasaki (JP); Koji Nozaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/180,784

(22) Filed: Jul. 12, 2011

(65) Prior Publication Data
US 2012/0100488 A1   Apr. 26, 2012

(30) Foreign Application Priority Data

Oct. 22, 2010   (JP) .................................. 2010-237942
Mar. 4, 2011    (JP) ................................. 2011-047713

(51) Int. Cl.
| | |
|---|---|
| *G03F 7/40* | (2006.01) |
| *H01L 21/027* | (2006.01) |
| *H01L 21/311* | (2006.01) |
| *H01L 21/3213* | (2006.01) |
| *H01L 21/768* | (2006.01) |

(52) U.S. Cl.
CPC ...... *H01L 21/0273* (2013.01); *H01L 21/31144* (2013.01); *H01L 21/32139* (2013.01); *H01L 21/76802* (2013.01); *G03F 7/40* (2013.01)
USPC ......................................................... 430/325

(58) Field of Classification Search
None
See application file for complete search history.

(56) References Cited

U.S. PATENT DOCUMENTS

| | | | |
|---|---|---|---|
| 4,692,277 A * | 9/1987 | Siklosi .......................... 510/432 |
| 6,171,346 B1 * | 1/2001 | Yeazell et al. .................... 8/158 |
| 6,488,753 B1 * | 12/2002 | Ito et al. ....................... 106/31.9 |
| 6,555,607 B1 | 4/2003 | Kanda | |
| 6,566,040 B1 | 5/2003 | Sugino | |
| 6,579,657 B1 | 6/2003 | Ishibashi | |
| 7,416,837 B2 | 8/2008 | Nozaki | |
| 2003/0098464 A1 | 5/2003 | Kon | |
| 2003/0175624 A1 | 9/2003 | Nozaki | |
| 2004/0029047 A1 | 2/2004 | Ishibashi | |
| 2004/0072098 A1 | 4/2004 | Kozawa | |
| 2005/0208429 A1 * | 9/2005 | DeYoung et al. ............. 430/311 |
| 2006/0188807 A1 | 8/2006 | Nozaki | |
| 2006/0258809 A1 * | 11/2006 | Sugeta et al. ................. 525/206 |
| 2006/0293397 A1 * | 12/2006 | Lassila et al. ................. 516/204 |
| 2008/0233491 A1 | 9/2008 | Endo et al. | |
| 2009/0081592 A1 | 3/2009 | Haijima et al. ............... 430/302 |
| 2010/0041816 A1 * | 2/2010 | Ikoshi et al. .................. 524/503 |

FOREIGN PATENT DOCUMENTS

| | | |
|---|---|---|
| CN | 101396932 | 4/2009 |
| EP | 1 429 185 A1 | 6/2004 |

(Continued)

OTHER PUBLICATIONS

Damas, et al. Behavior study of polyvinyl alcohol aqueous solution in presence of short chain micelle-forming polyols, Colloid. Polym. Sci. (2008) 286:999-1007.*

(Continued)

*Primary Examiner* — Cynthia H Kelly
*Assistant Examiner* — Alyssa L Cepluch
(74) *Attorney, Agent, or Firm* — Kratz, Quintos & Hanson, LLP

(57) ABSTRACT

To provide a resist matter improving material containing C4-11 linear alkanediol, and water.

4 Claims, 5 Drawing Sheets

(56) References Cited

FOREIGN PATENT DOCUMENTS

| | | |
|---|---|---|
| JP | 62-65326 | 3/1987 |
| JP | 5-197151 | 8/1993 |
| JP | 10-73927 | 3/1998 |
| JP | 11-204399 | 7/1999 |
| JP | 11-283910 | 10/1999 |
| JP | 2000-58506 | 2/2000 |
| JP | 2000-267268 | 9/2000 |
| JP | 2000-298356 | 10/2000 |
| JP | 2000-347414 | 12/2000 |
| JP | 2001-19860 | 1/2001 |
| JP | 2001-33984 | 2/2001 |
| JP | 2001-228616 A1 | 8/2001 |
| JP | 3237082 B2 | 10/2001 |
| JP | 2002-6491 A1 | 1/2002 |
| JP | 2002-6498 A1 | 1/2002 |
| JP | 2002-6512 A1 | 1/2002 |
| JP | 2002-23366 A1 | 1/2002 |
| JP | 2002-49161 A1 | 2/2002 |
| JP | 2003-035955 | 2/2003 |
| JP | 2003-84457 A1 | 3/2003 |
| JP | 2003-131400 A1 | 5/2003 |
| JP | 2003-162060 A1 | 6/2003 |
| JP | 2003-255564 A1 | 9/2003 |
| JP | 2004-53723 A1 | 2/2004 |
| JP | 2004-86203 A1 | 3/2004 |
| JP | 2004-126080 A1 | 4/2004 |
| JP | 2004-264373 A1 | 9/2004 |
| JP | 3633595 B2 | 1/2005 |
| JP | 2005-91415 A1 | 4/2005 |
| JP | 2005-208365 A1 | 8/2005 |
| JP | 2006-259692 A1 | 9/2006 |
| JP | 2007-213013 A1 | 8/2007 |
| JP | 2008-233750 | 10/2008 |
| JP | 2010-49247 A1 | 3/2010 |
| WO | WO 2004/074941 A1 | 9/2004 |

OTHER PUBLICATIONS

T. Ishibashi, et al.; "Advanced Micro-Lithography Process with Chemical Shrink Technology;" Jpn. J. Appl. Phys.; vol. 40; Part 1.; No. 1; Jan. 2001; pp. 419-425.

M. Terai, et al."Below 70-nm Contact Hole Pattern with RELACS Process on ArF Resist;" Advances in Resist Technology and Processing XX; Proceedings of SPIE; vol. 5039; 2003; pp. 789-797.

Office Action dated Sep. 28, 2012, issued for the corresponding Chinese application No. 201110226683.9.

Korean Office Action dated Dec. 20, 2013, issued in corresponding Korean Application No. 10-2011-76186, with English translation.

* cited by examiner

Mixing

RESIST PATTERN IMPROVING MATERIAL, METHOD FOR FORMING RESIST PATTERN, AND METHOD FOR PRODUCING SEMICONDUCTOR DEVICE

CROSS-REFERENCE TO RELATED APPLICATIONS

This application is based upon and claims the benefit of priority of the prior Japanese Patent Application No. 2010-237942, filed on Oct. 22, 2010, and Japanese Patent Application No. 2011-047713, filed on Mar. 4, 2011, the entire contents of which are incorporated herein by reference.

FIELD

The embodiments discussed herein are related to a resist pattern improving material, a method for forming a resist pattern, and a method for producing a semiconductor device.

BACKGROUND

To further improve integration degrees of semiconductors such as of a large scale integration (LSI), finer patterns are made during productions of semiconductors, and currently the smallest pattern size is 100 nm or smaller.

Formations of such fine patterns in semiconductor devices have been realized by shortening wavelength of light from a light source of exposure devices and improving resist materials. Currently, formations of fine patterns have been performed by a liquid immersion lithography, in which exposure is performed through water with a light source that emits argon fluoride (ArF) excimer laser light having a wavelength of 193 nm, and as a resist material used for such lithography, various ArF resist materials using acrylic resins as a base have been developed. Moreover, as a lithography technique of the next generation, an extreme ultraviolet (EUV) lithography using soft X rays having a wavelength of 13.5 nm as a light source has been studied, and therefore it is obvious that a pattern size will continue to be reduced, e.g. 30 nm or smaller, from now on.

As the pattern size is made smaller as mentioned above, unevenness of a pattern width becomes more significant, which may adversely affect performances of a resulting device.

To solve the aforementioned problems, there have attempts to optimize exposure devices and resist materials for use. However, sufficient results have not been provided. Moreover, improvements of exposure devices and resist materials take a lot of time and cost.

Accordingly, various countermeasures have been studied and provided in process conditions.

For example, there is disclosed in Japanese Patent Application Laid-Open (JP-A) No. 2007-213013 a method for improving LWR in which a resist pattern is treated with an aqueous solution containing an ionic surfactant during a rinsing process after a developing process so as to dissolve the roughness of the resist pattern at the same time as reducing defects (e.g. defects including residues, and deformation of the pattern) caused by the developing process (see JP-A No. 2007-213013).

Moreover, another method is disclosed in JP-A No. 2010-49247, and in this method an organic coating material, to which a low molecular acidic compound containing a carboxyl group, is applied to a resist pattern that has been developed, and the coating material is then removed to thereby improve LWR as well as sliming the resist pattern (see JP-A No. 2010-49247).

However, any of these methods has a problem that a desirable resist pattern size cannot be obtained as the improvement of LWR is realized by removing a surface of a resist pattern by processing. Moreover, these methods have a problem that LWR may be potentially worsened.

The present inventors have disclosed a resist pattern thickening material that enables precise processing by swelling (thickening) the resist pattern (see Japanese Patent (JP-B) No. 3633595, and JP-A No. 2006-259692).

In the case where a resist pattern is subjected to a thickening process using such resist pattern thickening material, however, a size of the resist pattern is largely changed. Therefore, it is not suitable for a material for improving LWR, which desirably improves LWR of a resist pattern, without changing a size of the resist pattern more than necessary.

Accordingly, it is a current situation that a resist pattern improving material, a method for forming a resist pattern, and a method for producing a semiconductor device, that can improve LWR of a resist pattern without changing a size thereof more than necessary.

SUMMARY

The present invention aims at providing a resist pattern improving material, a method for forming a resist pattern, and a method for producing a semiconductor device, that can improve LWR of a resist pattern without changing a size thereof more than necessary.

The disclosed resist pattern improving material contains: C4-11 linear alkanediol; and water.

The disclosed method for forming a resist pattern contains: after forming a resist pattern, applying the disclosed resist pattern improving material so as to cover a surface of the resist pattern.

The disclosed method for producing a semiconductor device contains: after forming a resist pattern on a processing surface, applying the disclosed resist pattern improving material so as to cover a surface of the resist pattern to thereby improve the resist pattern; and etching the processing surface using the improved resist pattern as a mask so as to pattern the processing surface.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

Figure 1A:
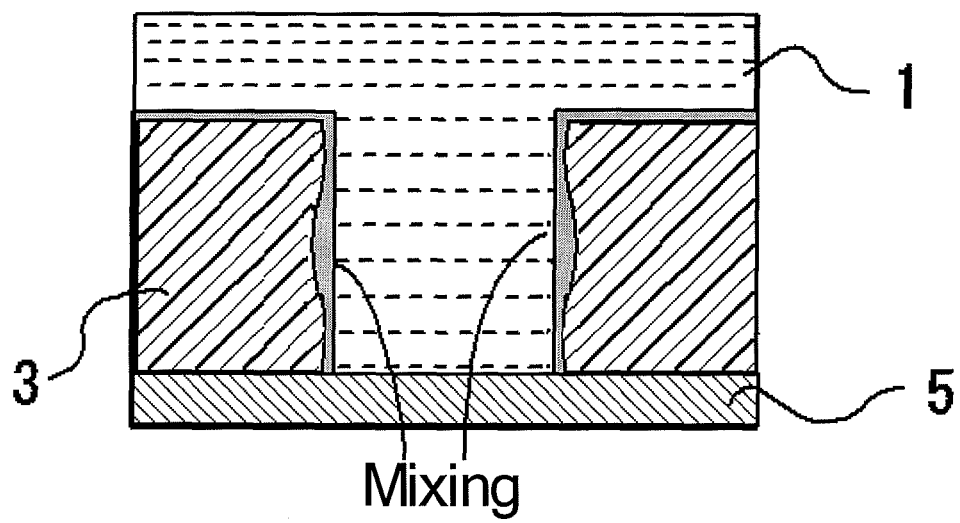
FIG. 1A is a diagram for explaining a mechanism for improving (reducing) LWR of a resist pattern using the resist pattern improving material of the invention, and illustrates the state where the resist pattern improving material is applied to a surface of the resist pattern.

DESCRIPTION OF EMBODIMENTS (Resist Pattern Improving Material)

The resist pattern improving material contains at least linear alkanediol, and water, and may further contain a water-soluble resin, a surfactant, and other substances, if necessary.

<Linear Alkanediol>

The linear alkanediol is appropriately selected depending on the intended purpose without any restriction, provided that it is C4-11 linear alkanediol, but it is preferred that the linear alkanediol is C5-9 linear alkanediol as such linear alkanediol contributes to further improve (reduce) line width roughness (LWR).

Moreover, the linear alkanediol is preferably a compound expressed by the following general formula 1, in view of the improvement of LWR.

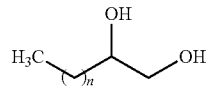

General Formula 1

In the general formula 1, n is an integer of 1 to 8, preferably 2 to 6.

The compound expressed by the general formula 1 is preferably selected from the group consisting of 1,2-pentanediol, 1,2-hexanediol, 1,2-heptanediol, 1,2-octanediol, and 1,2-nonanediol in view of the improvement of LWR.

It has been proved that 1,2-pentanediol, 1,2-hexanediol, and 1,2-octanediol have antibacterial properties (see JP-A No. 11-322591). As the resist pattern improving material contains water, the antibacterial properties of such compound help to prevent the resist pattern improving material from being decayed during storage. Accordingly, use of these compounds is preferable.

The linear alkanediol may be used independently, or two or more thereof may be used in combination.

An amount of the linear alkanediol for use is appropriately selected depending on the intended purpose without any restriction, but it is preferably 0.001 parts by mass or more relative to 100 parts by mass of water. Moreover, the amount thereof is preferably the upper limit of the amount thereof dissolved in the water of 20° C. (i.e. solubility to water of 20° C.) or lower. Furthermore, the amount of the linear alkanediol is preferably 0.01 parts by mass to 5 parts by mass, more preferably 0.05 parts by mass to 1 part by mass relative to 100 parts by mass of the water. When the amount thereof is less than 0.001 parts by mass, an effect of improving the LWR may not be sufficiently attained. When the amount thereof is more than the upper limit of the amount dissolved in the water of 20° C. (solubility), the resulting resist pattern improving material is a uneven fluid containing the undissolved linear alkanediol therein, and therefore an effect of improving the LWR may not be sufficiently attained. When the amount of the linear alkanediol is within the aforementioned more preferable range, the resulting resist pattern improving material improves the LWR, and therefore use of such amount is preferable.

<Water>

The water is appropriately selected depending on the intended purpose without any restriction, but it is preferably pure water (deionized water).

An amount of the water for use is appropriately adjusted depending on the intended purpose without any restriction, but it is preferably 80 parts by mass or more relative to 100 parts by mass of the resist pattern improving material for obtaining a desirable coating ability.

<Water-Soluble Resin>

Since the resist pattern improving material contains the water-soluble resin, the resist pattern improving material can improve the LWR of the resist pattern as well as thickening the resist pattern.

The water-soluble resin is appropriately selected depending on the intended purpose without any restriction. Examples thereof include polyvinyl alcohol, polyvinyl acetal, polyvinyl acetate, polyacrylic acid, polyvinyl pyrrolidone, polethylene imine, polyethylene oxide, a styrene-maleic acid copolymer, polyvinyl amine, polyallyl amine, an oxazoline group-containing water-soluble resin, a water-soluble melamine resin, a water-soluble urea resin, an alkyd resin, a sulfone amide resin, cellulose, tannin, polyglutamic acid, and resins containing the aforementioned resins at least in part thereof. These may be used independently or in combination.

Among them, polyvinyl alcohol, polyvinyl acetal, polyvinyl acetate, polyvinyl pyrrolidone, and resins containing these resins at least in part thereof are preferable in view of their stability.

The water solubility of the water-soluble resin is appropriately adjusted depending on the intended purpose. For example, such water solubility is preferable that 0.1 g or more of the water-soluble resin is dissolved in 100 g of water at 25° C.

An amount of the water-soluble resin for use is appropriately adjusted depending on the intended purpose without any restriction, but it is preferably 0.001 parts by mass to 10 parts by mass, more preferably 0.001 parts by mass to 4 parts by mass, relative to 100 parts by mass of the water. When the amount of the water-soluble resin for use is less than 0.001 parts by mass, the resulting resist pattern improving material may not have an effect of thickening a resist pattern at all. When the amount thereof is more than 10 parts by mass, although the resulting resist pattern improving material improves the LWR, the effect of thickening a resist pattern is excessively large, and therefore a resist pattern of the desired size may not be obtained. When the amount of the water-soluble resin is within the aforementioned more preferable range, the resulting resist pattern improving material can reduce roughness of side walls of a resist pattern with thickening the resist pattern within a desirable range, without excessively changing the size of the resist pattern to thereby improve the evenness of the resist pattern width (i.e. improving LWR).

<Surfactant>

The resist pattern improving material can improve a coating ability thereof to a resist pattern by further containing a surfactant.

The surfactant is appropriately selected depending on the intended purpose without any restriction. Examples thereof include a nonionic surfactant, a cationic surfactant, an anionic surfactant, and an amphoteric surfactant. These may be used independently, or in combination. Among them, the nonionic surfactant is preferable as such surfactant does not contain a metal ion such as a sodium salt, and a potassium salt.

The nonionic surfactant is appropriately selected depending on the intended purpose without any restriction. Examples of the nonionic surfactant include surfactants each containing alkoxylate, fatty acid ester, amide, alcohol, ethylenediamine, or the like. Specific examples of the nonionic surfactant include a polyoxyethylene-polyoxypropylene condensate compound, a polyoxyalkylene alkyl ether compound, a polyoxyethylene alkyl ether compound, a polyoxyethylene derivative compound, a sorbitan fatty acid ester compound, a glycerin fatty acid ester compound, a primary alcohol ethoxylate compound, a phenol ethoxylate compound, a nonylphenol ethoxylate compound, an octylphenol ethoxylate compound, a lauryl alcohol ethoxylate compound, an oleyl alcohol ethoxylate compound, a fatty acid ester compound, an amide compound, a natural alcohol compound, an ethylene diamine compound, and a secondary alcohol ethoxylate compound.

An amount of the surfactant for use is appropriately adjusted depending on the linear alkanediol and the water-soluble resin for use, or the amounts thereof, without any restriction. For example, the amount of the surfactant is preferably 2 parts by mass or less relative to 100 parts by mass of the water. When the amount of the surfactant is more than 2 parts by mass, precipitations may be generated at the time of the application, or defects may be formed on the resist pattern.

<Other Substances>

Other substances are appropriately selected depending on the intended purpose without any restriction, and examples thereof include an organic solvent, and various additives known in the art (e.g. quenchers such as an amine quencher, an amide quencher, and ammonium chloride).

Each amount of other substances is appropriately adjusted depending on the linear alkanediol and the water-soluble resin for use, or the amounts thereof, without any restriction.

—Organic Solvent—

By adding an organic solvent to the resist pattern improving material, an effect of improving the solubility of the linear alkanediol, and the water-soluble resin.

The organic solvent is appropriately selected depending on the intended purpose without any restriction, and examples thereof include an alcohol organic solvent, a chain ester organic solvent, a cyclic ester organic solvent, a ketone organic solvent, a chain ether organic solvent, and a cyclic ether organic solvent.

The alcohol organic solvent is appropriately selected depending on the intended purpose without any restriction, and examples thereof include methanol, ethanol, propyl alcohol, isopropyl alcohol, and butyl alcohol.

The chain ester organic solvent is appropriately selected depending on the intended purpose without any restriction, and examples thereof include ethyl lactate, and propylene glycol methyl ether acetate (PGMEA).

The cyclic ester organic solvent is appropriately selected depending on the intended purpose without any restriction, and examples thereof include a lactone organic solvent such as γ-butyrolactone.

The ketone organic solvent is appropriately selected depending on the intended purpose without any restriction, and examples thereof include a ketone organic solvent such as acetone, cyclohexanone, and heptanone.

The chain ether organic solvent is appropriately selected depending on the intended purpose without any restriction, and examples thereof include ethylene glycol dimethyl ether.

The cyclic ether organic solvent is appropriately selected depending on the intended purpose without any restriction, and examples thereof include tetrahydrofuran, and dioxane.

These organic solvents may be used independently, or in combination. Among them, organic solvent having a boiling point of 80° C. to 200° C. are preferable as they contribute to effective reduction of roughness of a resist pattern.

The form of the resist pattern improving material is appropriately selected depending on the intended purpose without any restriction, and examples thereof include an aqueous solution, a colloid solution, and an emulsion. Among them, the aqueous solution is preferable in view of its coating ability.

<Use and the Like>

The resist pattern improving material can be used by applying the same to a resist pattern.

The resist pattern improving material is applied onto the resist pattern so as to allow the resist pattern improving material to interact (mix) with the resist pattern, and as a result, a layer (a mixing layer) formed by the interaction between the resist pattern improving material and the resist pattern is formed at the surface of the resist pattern. The formation of the mixing layer reduces the roughness of the side walls of the resist pattern, so that a resist pattern whose LWR has been improved is formed.

A conventional surfactant is a high molecular compound having a molecular weight of a few hundreds or more, having repeating units within one s molecule thereof. Compared to this, the linear alkanediol has a low molecular weight and size closer to a solvent, and therefore the linear alkanediol easily penetrates into the resist pattern, and has an effect for reducing roughness of side walls of the resist pattern.

As a result of the reduction of the roughness of the side walls of the resist pattern with the resist pattern improving material, the uniformity of the line width of the resist pattern is improved compared with that before the reduction of the roughness, i.e., unevenness of the line width of the resist pattern (line width roughness (LWR)) is improved. As a result of the improved LWR, more precise resist pattern is formed extending the exposure limit (dissolution limit) of a light source of an exposure device used for the patterning of the resist pattern (smaller than the size of the opening and/or pattern pitch which can be patterned by a wavelength of the light of the light source).

Moreover, in the case where the resist pattern improving material further contain the water-soluble resin as well as the linear alkanediol, such material thickens a resist pattern at the same time as reducing the roughness of the side walls of the resist pattern. By thickening the resist pattern, the roughness of the side walls of the resist pattern is reduced even more.

The reduction rate of the roughness of the side walls of the resist pattern, uniformity of the width of the resist pattern, and thickening amount can be controlled in the desirable ranges by appropriately adjusting amounts of the linear alkanediol and the water-soluble resin in the resist pattern improving material, viscosity of the resist pattern improving material, the applied thickness, the baking temperature, the baking duration, and the like.

—Material of Resist Pattern—

The material of the resist pattern (i.e. a resist pattern to which the resist pattern improving material is applied) is appropriately selected from resist materials known in the art depending on the intended purpose without any restriction, and it may be any of negative or positive. Examples thereof include those can be patterned by g-line, i-line, KrF excimer laser light, ArF excimer laser light, $F_2$ excimer laser light, an electron beam and the like, such as a g-line resist, an i-line resist, a KrF resist, an ArF resist, a $F_2$ resist, an electron beam resist, and the like. There may be of chemically amplified, or of chemically non-amplified. Among them, a KrF resist, an ArF resist, a resist containing an acrylic resin are preferable, at least one of the ArF resist the extension of the resolution limit of which has been urgently desired and the resist containing an acrylic resin is more preferable in view of the finer patterning, and the improvement of through-put.

Specific examples of the materials for the resist pattern include a novolak-based resist, a PHS-based resist, an acryl-based resist, a cycloolefin-maleic acid anhydride(COMA)-based resist, a cycloolefin-based resist, and a hybrid (alicyclic acryl-COMA copolymer) resist. These may be fluorine-modified, or has other modification.

The formation method, size, thickness, and the like of the resist pattern are appropriately selected without any restriction. Especially, the thickness of the resist pattern is appropriately adjusted depending on the processing surface which is a subject for the process, the etching conditions, and the like, but is generally approximately 100 nm to approximately 500 nm.

Hereinafter, reduction of a roughness of a side wall of the resist pattern using the resist pattern improving material will be explained with reference to the drawings.

Figure 1B:
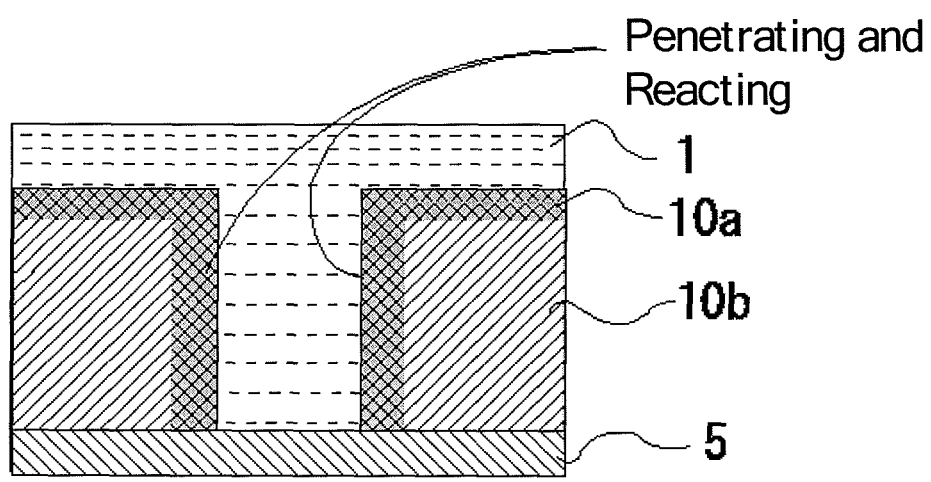
FIG. 1B is a diagram for explaining a mechanism for improving (reducing) LWR of a resist pattern using the resist pattern improving material of the invention, and illustrates the state where the resist pattern improving material is penetrated into the surface of the resist pattern.

As illustrated in FIG. 1A, after forming a resist pattern 3 on a processing surface (of a base) 5, a resist pattern improving material 1 is applied (coated) to a surface of the resist pattern 3 to form a coating film. Thereafter, baking (heating and drying) may be performed, if necessary. As a result, the resist pattern improving material 1 is mixed with the resist pattern 3 (the resist pattern 3 is impregnated with the resist pattern improving material 1) at the interface between the resist pattern 3 and the resist pattern improving material 1, to thereby form a surface layer (a mixing layer) 10a by reacting the mixed (impregnated) portion at an interface between an inner resist pattern 10b (the resist pattern 3) and the resist pattern improving material 1, as illustrated in FIG. 1B. The formation of the surface layer is owing to penetration of the resist pattern improving material into the resist pattern 3 due to a surface active effect thereof and a reaction due to a polar group. As a result, roughness of side walls of the inner resist pattern 10b (resist pattern 3) is stably and uniformly reduced without affected by the size of the inner resist pattern 10b (resist pattern 3).

Figure 1C:
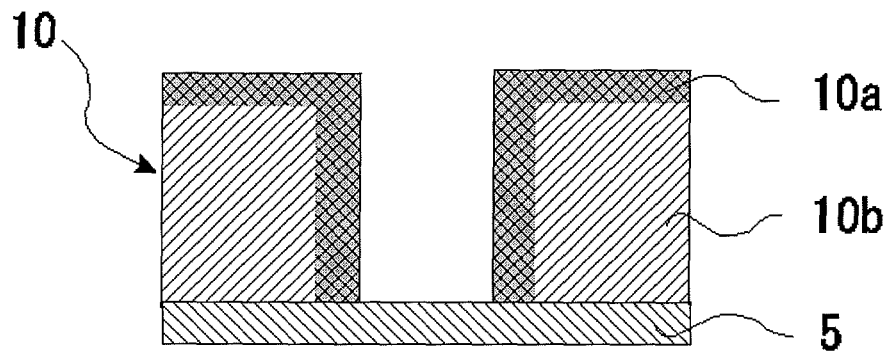
FIG. 1C is a diagram for explaining a mechanism for improving (reducing) LWR of a resist pattern using the resist pattern improving material of the invention, and illustrates the state where the surface of the resist pattern is improved with the resist pattern improving material.

Thereafter, as illustrated in FIG. 1C, the portion of the applied the resist pattern improving material 1 where the resist pattern improving material 1 is not interacted (mixed) with the resist pattern 3, and/or the portion of the applied the resist pattern improving material 1 where interaction (mixing) between the resist pattern improving material 1 and the resist pattern 3 is weak (i.e. highly water-soluble portion) is dissolved and removed by developing, to thereby form (develop) a smooth resist pattern 10 in which roughness of side walls thereof has been reduced.

Note that, the developing may be water developing or developing using an alkaline developer. Moreover, an alkaline developer containing a surfactant or water can be optionally used, and details of such developer will be explained later.

The resist pattern 10 whose roughness has been reduced contains a surface layer (mixing layer) 10a, which is formed by reacting with the resist pattern improving material 1, on a surface of the inner resist pattern 10b (resist pattern 3). The resist pattern 10 whose roughness has been reduced has the roughness which has been reduced by the portion of the surface layer (mixing layer) 10a compared to the resist pattern 3, and therefore line width roughness (LWR) value thereof, which represents a variation (unevenness) of line widths of a resist pattern formed by the roughness-reduced resist pattern 10 is smaller than the variation of line widths of the resist pattern formed by the resist pattern 3 before reduction of the roughness. Accordingly, a precise resist pattern can be highly accurately formed by extending the exposure limit (dissolution limit) of the light source of the exposure device used for forming the resist pattern 3.

In the case where the resist pattern improving material 1 contains a water-soluble resin, a surface layer (mixing layer) 10a formed with the resist pattern improving material is bigger than that formed with the resist pattern improving material without containing the water-soluble resin. Since the roughness-reduced resist pattern 10 has a roughness reduced by the portion of the surface layer (mixing layer) 10a compared to the resist pattern 3, and also has been thickened with the resist pattern improving material, line width roughness (LWR) value thereof, which represents a variation (unevenness) of line widths of a resist pattern formed by the roughness-reduced resist pattern 10 is much smaller than the variation of line widths of the resist pattern formed by the resist pattern 3 before reduction of the roughness.

The disclosed resist pattern improving material improves LWR by reducing roughness of side walls of a resist pattern, and is suitably used for making the resist pattern precise extending the exposure limit. Moreover, the disclosed resist pattern improving material is particularly suitably used for the method for producing a semiconductor device, which will be described later, and the like.

(Method for Forming Resist Pattern)

The method for forming a resist pattern contains at least a coating step with the resist pattern improving material, preferably further contains a developing step, and if necessary, further contains other steps such as an exposure step and a baking step.

<Coating Step>

The coating step is appropriately selected depending on the intended purpose without any restriction, provided that the coating step is, after forming a resist pattern, applying a resist pattern improving material so as to cover a surface of the resist pattern.

The resist pattern can be formed in accordance with any of methods known in the art.

The resist pattern can be formed on a processing surface (of a base). The processing surface (of the base) is appropriately selected depending on the intended purpose without any restriction. In the case where the resist pattern is formed in the course of productions of a semiconductor device, examples of the processing surface (of the base) is a surface of a semiconductor substrate. As such semiconductor substrate, substrates such as silicon wafers, and various oxidized films are preferable.

The method for applying the resist pattern improving material is appropriately selected from coating methods known in the art depending on the intended purpose without any restriction. For example, spin coating is preferable.

In the case of the spin coating, the revolution speed thereof is appropriately adjusted depending on the intended purpose without any restriction, but it is preferably 100 rpm to 10,000 rpm, more preferably 500 rpm to 5,000 rpm, and the duration for the coating is preferably 1 second to 10 minutes, more preferably 1 second to 90 seconds.

At the time of the application, the applied thickness is generally approximately 5 nm to approximately 1,000 nm, preferably approximately 10 nm to approximately 100 nm.

<Developing Step>

The developing step (development process) is appropriately selected depending on the intended purpose without any restriction, provided that it is developing the resist pattern, whose surface is covered with the resist pattern improving material, with a developer containing water.

As a result of the developing, within the applied resist pattern improving material, a portion where the resist pattern improving material has not been interacted (mixed) with the resist pattern, or a portion where the interaction between the resist pattern improving material and the material of the resist pattern is weak is made dissolved and removed so that the resist pattern whose roughness of side walls is reduced can be developed (obtained). For this reason, the aforementioned developing is preferable.

The developing is appropriately selected depending on the intended purpose without any restriction, and may be a water developing or an alkali developing. It is also preferred that the developing be performed with water containing a surfactant, or an alkaline developer containing a surfactant. In view of easiness of the process, the water developing is preferable.

In the case where the surfactant is added to the developer, uniformity of the thickened effect at the interface between the resist pattern improving material and the resist pattern is improved within the processing surface, and the generation of residual substances or defects can be reduced.

The surfactant is appropriately selected depending on the intended purpose without any restriction, but it is preferably a nonionic surfactant as the nonionic surfactant does not contain a metal ion such as a sodium salt, and a potassium salt.

The nonionic surfactant is appropriately selected depending on the intended purpose without any restriction. Examples of the nonionic surfactant include a polyoxyethylene-polyoxypropylene condensate compound, a polyoxyalkylene alkyl ether compound, a polyoxyethylene alkyl ether compound, a polyoxyethylene derivative compound, a silicone compound, a sorbitan fatty acid ester compound, a glycerin fatty acid ester compound, an alcohol ethoxylate compound, and a phenol ethoxylate compound. These may be used independently or in combination. Note that, an ionic surfactant can be also used as long as it is of non-metal salt.

An amount of the surfactant for use in water (a developer) is appropriately adjusted depending on the intended purpose without any restriction, but is preferably 0.001% by mass to 1% by mass, more preferably 0.05% by mass to 0.5% by mass.

When the amount thereof is less than 0.001% by mass, the effect from the surfactant is insufficient. When the amount thereof is more than 1% by mass, the solvency of the developer becomes excessive, and thus the developer may dissolve the resist pattern, which increases roughness of the side walls of the resist pattern, as well as generating the residual substances or defects due to the formation of bubbles.

The alkali developer is appropriately selected from those conventionally used for the production of a semiconductor device, without any restriction. Preferable examples thereof include a quaternary ammonium hydroxide aqueous solution, and a choline aqueous solution. These may be used independently or in combination. Among them, a tetramethylammonium hydroxide aqueous solution is preferable as it is inexpensive and versatile.

Moreover, to the alkali developer, a surfactant may be optionally added. In this case, an amount of the surfactant in the alkali developing solution is appropriately adjusted depending on the intended purpose without any restriction. The amount thereof is the same as the above, preferably 0.001% by mass to 1% by mass, more preferably 0.05% by mass to 0.5% by mass.

<Other Steps>

Examples of other steps include the exposure step, and the baking step.

—Exposure Step—

The exposure step is applying UV-rays or ionizing radiation to an entire surface of the resist pattern before applying the resist pattern improving material thereto.

Specifically, when the resist pattern having various pitches including the region where the resist pattern is spaced (the region where the resist pattern has a long pitch) and the region where the resist pattern is dense (the region where the resist pattern has a short pitch), or the resist pattern having various sizes of convex portions is processed, a light intensity distribution for exposure is different every pattern. The slight difference of the surface conditions (the difference in the fogging exposure value) in such a degree that will not be noticed by the developing of the resist pattern will affect as a difference in permeability of the resist pattern improving material to the resist pattern. As a result, it affects the formation of the mixing layer formed by the interaction between the resist pattern and the resist pattern improving material in terms of the easiness for the formation. When the entire surface of the resist pattern is exposed to the UV-ray or the ionizing radiation before the application of the resist pattern improving material, the surface conditions of the resist pattern are unified, and thus the permeability of the resist pattern improving material to the resist pattern can be unified without depending on the density or size of the resist pattern, which helps to effectively reduce the roughness of the side walls of the resist pattern, and to improve the uniformity of the resist pattern width.

The UV-ray and the ionizing radiation are appropriately selected depending on the sensitive wavelength range of the materials for the resist pattern without any restriction. Specific examples thereof include a broad band UV-ray emitted from a high pressure mercury lamp or low pressure mercury lamp, g-line (a wavelength of 436 nm), i-line (a wavelength of 365 nm), KrF excimer laser light (a wavelength of 248 nm), ArF excimer laser light (a wavelength of 193 nm), $F_2$ excimer laser light (a wavelength of 157 nm), EUV-ray (a soft X-ray region of a wavelength of 5 nm to 15 nm), an electron beam, and X-ray. Note that, among them, the one that is the same as the UV-ray or the ionizing radiation used for the exposure for forming the resist pattern is preferable in view of the structure of the production device.

The irradiance (the exposure dose) of the UV-ray or the ionizing radiation to the resist pattern is appropriately selected depending on the type of the UV-ray or the ionizing radiation for use without any restriction. For example, it is preferably 0.1% to 20% relative to the irradiance (the exposure dose) for the formation of the resist pattern.

When the irradiance is less than 0.1%, the surface conditions of the resist pattern may not be unified sufficiently. When the irradiance is more than 20%, the photoreaction is excessively induced in the resist pattern, and thus the upper portion of the resist pattern may be degraded in terms of the shape thereof, or the pattern may be partially lost.

The method for the exposure is not particularly restricted provided that the UV-ray or the ionizing radiation is applied at the constant irradiance mentioned earlier. It is suitably adjusted and carried out in such a manner that the exposure of the strong light is carried out in a short period, the exposure of the weak light is carried out in a long period, the exposure to the highly sensitive resist material is carried out at the low exposure dose (irradiance), or the exposure to the resist material having low sensitivity is carried out at the high exposure dose (irradiance).

—Baking Step—

The baking step is baking (heating and drying) the applied resist pattern improving material during or after the application of the resist pattern improving material.

The baking efficiently induces the mixing (impregnation) of the resist pattern improving material to the resist pattern at the interface between the resist pattern and the resist pattern improving material. Note that, since a coating film of the resist pattern improving material can be formed by applying the resist pattern improving material by spin coating, and removing the solvent, the baking may not be performed.

Note that, the condition, method, and the like of the baking (heating and drying) are appropriately selected depending on the intended purpose without any restriction, provided that the resist pattern is not softened thereby. The number for performing the baking may be once, or two or more times. In the case where the baking is performed two or more times, the temperature of the baking may be constant or different each time. In the case where the temperature is constant, the temperature is preferably approximately 40° C. to approximately 150° C., more preferably 60° C. to 120° C., and the duration is preferably approximately 10 seconds to approximately 5 minutes, more preferably 30 seconds to 100 seconds.

The method for forming the resist pattern is suitably for forming various patterns (negative to resist patterns), such as a line-space pattern, a hole pattern (e.g. contact hole) and a trench (groove) pattern, and the resist pattern formed by the method for forming the resist pattern can be used as a mask pattern and a reticle pattern. Moreover, the method for forming the resist pattern can be suitably used for productions of metal plugs, various wirings, magnetic heads, liquid crystal displays (LCD), plasma display panels (PDP), functional parts such as a surface acoustic wave (SAW) filter, optical parts used for connections of optical wiring, precision parts such as a microactuator, and semiconductor devices. Furthermore, the method for forming the resist pattern is suitably used in the method for producing a semiconductor device, which will be explained later.

(Method for Producing Semiconductor Device)

The method for producing a semiconductor device contains at least a resist pattern forming step, and a patterning step, and may further contain other steps, if necessary.

<Resist Pattern Forming Step>

The resist pattern forming step is, after forming a resist pattern on a processing surface, applying the resist pattern improving material so as to cover a surface of the resist pattern to thereby improve the resist pattern. As a result of the resist pattern forming step, a resist pattern in which a roughness of side walls of the resist pattern is reduced and uniformity of the resist pattern width is improved can be formed on the processing surface.

The details of the resist pattern forming step is the same as those of the method for forming a resist pattern.

Examples of the processing surface include surface layers of various members in a semiconductor device, but among them, a substrate or a surface of a substrate (e.g. silicon wafer), and various oxidized films are preferable. The processing surface is preferably an interlayer insulating material having dielectric constant of 2.7 or lower.

The resist pattern is as described earlier.

The coating method is as described earlier. Moreover, it is preferred that the aforementioned baking be performed after the coating.

<Patterning Step>

The patterning step is etching the processing surface using the resist pattern formed in the resist pattern forming step as a mask (as a mask pattern) to pattern the processing surface.

The method of the etching is appropriately selected from methods known in the art depending on the intended purpose without any restriction, but it is preferably dry etching. The conditions of the etching are appropriately selected depending on the intended purpose without any restriction.

According to the method for producing a semiconductor device of this embodiment, various semiconductor devices, such as a flash memory, DRAM, and FRAM can be efficiently produced.

The disclosed resist pattern improving material can improve LWR of a resist pattern without changing the size of the resist pattern more than necessary.

The disclosed method for forming a resist pattern can attain a resist pattern whose LWR has been improved without changing the size of the resist pattern more than necessary.

The disclosed method for producing a semiconductor device can produce highly precise semiconductor device.

EXAMPLES

The present invention will be more specifically explained with reference to Examples, but these Examples shall not be construed as limiting to the scopes of the claims in any way.

Example 1

Preparation of Resist Pattern Improving Material

Resist pattern improving materials A to Z and comparative materials a to d each having the respective formulation presented in Tables 1-1 and 1-2 were prepared.

The values within the brackets presented in Tables 1-1 and 1-2 represents formulated amounts (part(s) by mass).

In Tables 1-1 and 1-2, "PVA" denotes polyvinyl alcohol (PVA-205C, manufactured by Kuraray Co., Ltd.), and "PVPd" denotes polyvinyl pyrrolidone (manufactured by Kanto Chemical Co., Inc.). Moreover, in the column "Others", "2HBA" denotes 2-hydroxybenzyl alcohol (manufactured by Sigma-Aldrich Corporation), and "TN-80" denotes a nonionic surfactant (primary alcohol ethoxylate surfactant, manufactured by ADEKA CORPORATION).

Note that, alkanediols are all reagents (all manufactured by TOKYO CHEMICAL INDUSTRY CO., LTD.).

Moreover, as the water, pure water (deionized water) was used, an amount of the water was set to 100 parts by mass in each formulation.

TABLE 1-1

| Improving material | Linear alkanediol (parts by mass) | Water-soluble resin (part(s) by mass) | Others (parts by mass) |
|---|---|---|---|
| A | 1,2-pentanediol (0.1) | — | — |
| B | 1,2-hexanediol (0.1) | — | — |
| C | 1,2-heptanediol (0.1) | — | — |
| D | 1,2-octanediol (0.1) | — | — |
| E | 1,2-pentanediol (0.1) | PVA (1) | — |
| F | 1,2-hexanediol (0.1) | PVA (1) | — |
| G | 1,2-heptanediol (0.1) | PVA (1) | — |
| H | 1,2-octanediol (0.1) | PVA (1) | — |
| I | 1,2-octanediol (0.05) | PVA (1) | — |
| J | 1,2-octanediol (0.01) | PVA (1) | — |
| K | 1,2-octanediol (0.1) | PVA (0.5) | — |
| L | 1,2-octanediol (0.1) | PVA (0.1) | — |
| M | 1,2-pentanediol (0.1) | PVPd (1) | — |
| N | 1,2-hexanediol (0.1) | PVPd (1) | — |
| O | 1,2-heptanediol (0.1) | PVPd (1) | — |
| P | 1,2-octanediol (0.1) | PVPd (1) | — |
| Q | 1,2-hexanediol (5) | — | — |
| R | 1,2-octanediol (0.1) | PVA (4) | — |
| S | 1,2-octanediol (0.1) | PVA (1) | TN-80 (0.002) |
| T | 1,2-nonanediol (0.05) | PVA (1) | — |
| U | 1,8-octanediol (0.1) | — | — |
| V | 3,6-octanediol (0.1) | — | — |
| W | 1,8-octanediol (0.1) | PVA (1) | — |
| X | 3,6-octanediol (0.1) | PVA (1) | — |
| Y | 1,8-octanediol (0.1) | PVPd (1) | — |
| Z | 3,6-octanediol (0.1) | PVPd (1) | — |

TABLE 1-2

| Material | Linear alkanediol (parts by mass) | Water-soluble resin (part by mass) | Others (part(s) by mass) |
|---|---|---|---|
| a | — | PVA (1) | 2HBA (1) TN-80 (0.06) |
| b | — | PVA (1) | 2HBA (0.02) TN-80 (0.003) |
| c | — | PVA (1) | — |
| d | — | PVA (1) | 2HBA (0.1) |

—Formation of Resist Pattern—

The resist pattern improving material prepared in the aforementioned manner was applied to a line-space pattern, which was formed of a alicyclic ArF resist (manufactured by TOKYO OHKA KOGYO CO., LTD.) and had a width of 96 nm (pitch: 180 nm) and LWR of 6.6 nm (corresponding to "unprocessed" in Tables 2-1 and 2-2) by spin coating, initially at 850 rpm for 5 seconds, and then at 2,000 rpm for 40 seconds. Thereafter, baking was performed at 110° C. for 60 seconds, followed by rinsing the resist pattern improving material with pure water for 60 seconds (developing process) to remove unreacted portions in which interactions (mixing) did not occur. In this manner, a resist line pattern was formed using each of the resist pattern improving materials A to Z, and reference materials a to d.

A line width size of the obtained resist line pattern ("size after processing" in Tables 2-1 and 2-2), changed amount in the size of the line width ("amount of change" in Tables 2-1 and 2-2), and moreover variations in the line pattern width ("LWR" in Tables 2-1 and 2-2) and an improvement rate of LWR(%) are presented in Tables 2-1, and 2-2. In Tables 2-1 and 2-2, "A" to "Z" and "a" to "d" are corresponded to the resist pattern improving materials A to Z and reference materials a to d, respectively.

Note that, the line width is an average value of measured values of the line width at 6 points within the area observed by means of CD SEM. Moreover, LWR was obtained by tripling the standard deviation ($\sigma$) of the variation of the line width within the approximately 720 nm-length region. Furthermore, the ratio of the improved amount in the value of LWR after processing with respect to the value of LWR of the unprocessed patter was obtained from the following equitation, and this ratio was determined as "LWR improvement rate (%)".

LWR improvement rate (%)=[(LWR of unprocessed pattern−LWR after processing)/(LWR of unprocessed pattern)]×100

TABLE 2-1

| Improving material | Size after processing (nm) | Amount of change (nm) | LWR (nm) | LWR improvement rate (%) |
|---|---|---|---|---|
| Unprocessed | 96 | — | 6.6 | — |
| A | 97 | 1 | 4.9 | 26 |
| B | 97 | 1 | 4 | 39 |
| C | 96 | 0 | 4.7 | 29 |
| D | 97 | 1 | 3.7 | 44 |
| E | 102 | 6 | 4.5 | 32 |
| F | 103 | 7 | 4 | 39 |
| G | 102 | 6 | 4.5 | 32 |
| H | 104 | 8 | 3.5 | 47 |
| I | 103 | 7 | 4 | 39 |
| J | 105 | 9 | 4.8 | 27 |
| K | 99 | 3 | 3.6 | 45 |
| L | 99 | 3 | 3.7 | 44 |
| M | 97 | 1 | 4.5 | 32 |
| N | 103 | 7 | 3.7 | 44 |
| O | 101 | 5 | 4.7 | 29 |
| P | 101 | 5 | 3.1 | 53 |
| Q | 100 | 4 | 4.9 | 26 |
| R | 113 | 17 | 4.5 | 32 |
| S | 107 | 11 | 4.4 | 33 |
| T | 101 | 5 | 4 | 39 |
| U | 97 | 1 | 4.1 | 38 |
| V | 98 | 2 | 4.2 | 36 |
| W | 105 | 9 | 4 | 39 |
| X | 104 | 8 | 4 | 39 |
| Y | 100 | 4 | 4.1 | 38 |
| Z | 101 | 5 | 4.3 | 35 |

TABLE 2-2

| Material | Size after processing (nm) | Amount of change (nm) | LWR (nm) | LWR improvement rate (%) |
|---|---|---|---|---|
| Unprocessed | 96 | — | 6.6 | — |
| a | 127 | 31 | 5.6 | 15 |
| b | 103 | 7 | 6.1 | 8 |
| c | Unable to coat | — | — | — |
| d | 108 | 12 | 6.2 | 6 |

It can be confirmed from Table 2-1 that use of the resist pattern improving materials A to Z improved the LWR, i.e. uniformity of the resist pattern width improved.

Among the linear alkanediols used, 1,2-octanediol had the highest effect for improving the LWR value, followed by 1,2-hexanediol.

Among the amounts of the linear alkanediol used, the amount range from 0.01 parts by mass to 5 parts by mass relative to 100 parts by mass of the water gave the highest effect for improving the LWR value.

In the case where the water-soluble resin was contained in the resist pattern improving material, the resulting resist pattern improving material was capable of thickening the resist pattern, and also had the high effect for improving the LWR value compared to the materials without containing the water-soluble resin.

In the case of the conventional resist pattern thickening materials each containing 2HBA (reference materials a, b, d), the effect for improving the LWR value was low even though proportions of the ingredients were changed in each material. Moreover, in the case of the material contains only PVA (reference material c), the resist pattern could not be coated with such material.

Example 2

Production 1 of Semiconductor Device

Figure 2A:
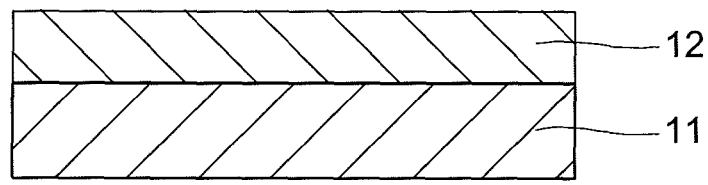
FIG. 2A is a schematic diagram for explaining one example of the method for producing a semiconductor device of the invention, and illustrates the state where an interlayer insulating film is formed on a silicon substrate.
Figure 2B:
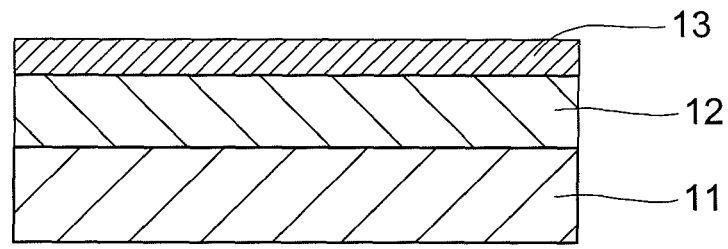
FIG. 2B is a schematic diagram for explaining one example of the method for producing a semiconductor device of the invention, and illustrates the state where a titanium film is formed on the interlayer insulating film of FIG. 2A.
Figure 2C:
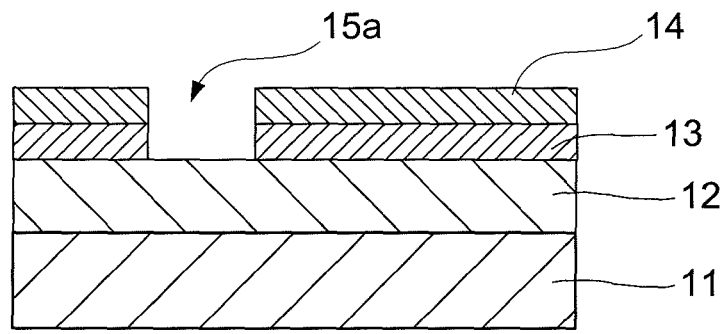
FIG. 2C is a schematic diagram for explaining one example of the method for producing a semiconductor device of the invention, and illustrates the state where a resist film is formed on the titanium film and a hole pattern is formed in the titanium film.
Figure 2D:
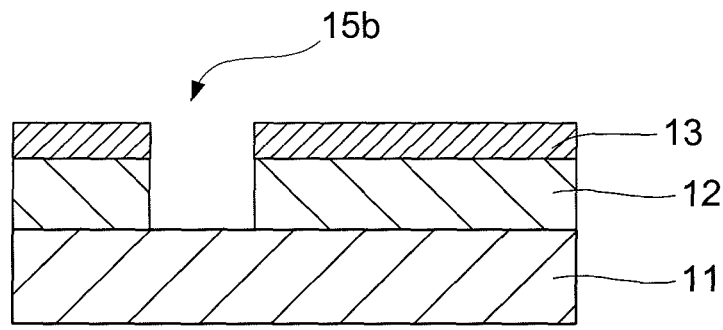
FIG. 2D is a schematic diagram for explaining one example of the method for producing a semiconductor device of the invention, and illustrates the state where a hole pattern is also formed in the interlayer insulating film.

An interlayer insulating film 12 was formed on a silicon substrate 11 as illustrated in FIG. 2A, and a titanium film 13 was formed on the interlayer insulating film 12 by sputtering as illustrated in FIG. 2B. Next, as illustrated in FIG. 2C, a resist pattern 14 was formed by double patterning, and the titanium film 13 was patterned, using the resist pattern as a mask, by reactive ion etching to form an opening 15a. Sequentially, an opening 15b was formed in the interlayer insulating film 12 using the titanium film 13 as a mask, as illustrated in FIG. 2D, as well as removing the resist pattern 14 by reactive ion etching.

Figure 2E:
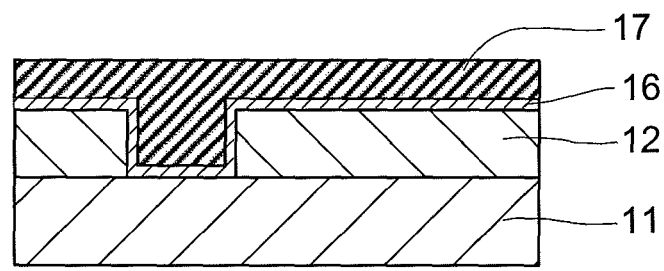
FIG. 2E is a schematic diagram for explaining one example of the method for producing a semiconductor device of the invention, and illustrates the state where a Cu film is formed on the interlayer insulating film in which the hole pattern has been formed.
Figure 2F:
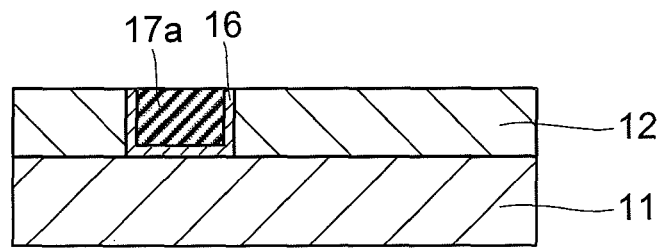
FIG. 2F is a schematic diagram for explaining one example of the method for producing a semiconductor device of the invention, and illustrates the state where the Cu deposited on the area of the interlayer insulating film where the hole pattern has not been provided is removed.

Next, the titanium film 13 was removed by a wet treatment, and a TiN film 16 was formed on the interlayer insulating film 12 by sputtering as illustrated in FIG. 2E, followed by forming a Cu film 17 on the TiN film 16 by electroplating. Thereafter, as illustrated in FIG. 2F, the surface was flattened by chemical-mechanical planarization (CMP) so as to leave the barrier metal and the Cu film (first metal film) in the groove corresponded to the opening 15b (FIG. 2D) to thereby form a first layer wiring 17a.

Figure 2G:
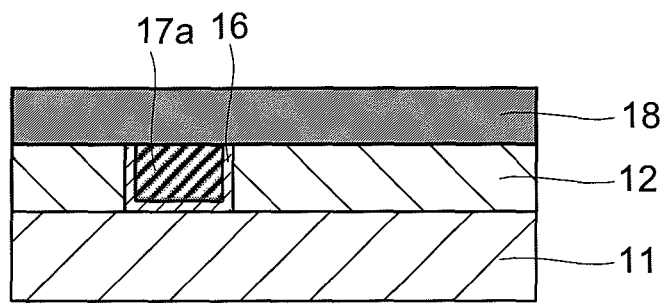
FIG. 2G is a schematic diagram for explaining one example of the method for producing a semiconductor device of the invention, and illustrates the state where an interlayer insulating film is formed on a Cu plug, which has been formed in the hole pattern, and on the interlayer insulating film.
Figure 2H:
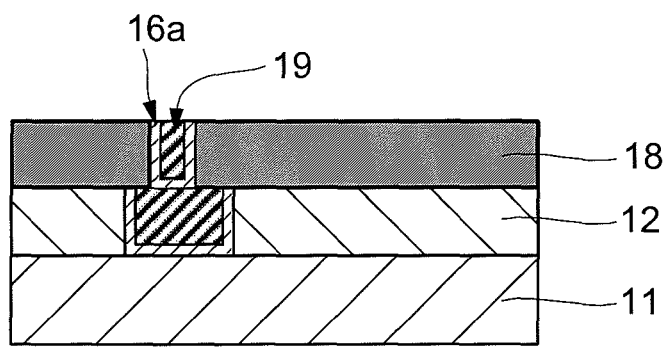
FIG. 2H is a schematic diagram for explaining one example of the method for producing a semiconductor device of the invention, and illustrates the state where a hole pattern is formed in the interlayer insulating film serving as a surface layer, and a Cu plug is formed.

Then, as illustrated in FIG. 2G, after forming an interlayer insulating film 18 on the first layer wiring 17a, as illustrated in FIG. 2H, a Cu plug (a second metal film) 19 for connecting the first layer wiring 17a with an upper layer wiring mentioned later, and a TiN film 16a were formed in the same manner illustrated in FIGS. 2A to 2F.

Figure 2I:
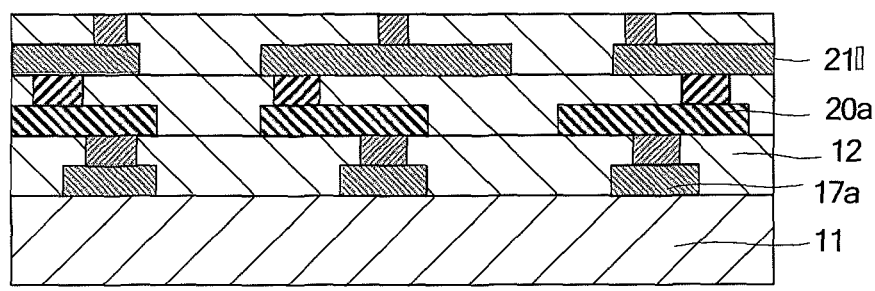
FIG. 2I is a schematic diagram for explaining one example of the method for producing a semiconductor device of the invention and illustrates the state where a wiring of three-layer structure is formed.

By repeating each steps, as illustrated in FIG. 2I, a semiconductor device having a multilayer-wiring structure including the first layer wiring 17a, the second layer wiring 20a and the third layer wiring 21a above the silicon substrate 11 was produced. Note that, in FIG. 2I, the barrier metal layer formed below each layer wiring is not illustrated.

In Example 2, the resist pattern 14 was a resist pattern formed by using the resist pattern improving material D of Example 1.

Moreover, the interlayer insulating film 12 was a low dielectric film having a dielectric constant of 2.7 or lower. Examples of such layer include a microporous silica film (CERAMATE NCS, manufactured by JCG Catalysts and Chemicals Ltd., dielectric constant: 2.25), and a fluorocarbon film (dielectric constant: 2.4) deposited and formed with a mixed gas of $C_4F_8$ and $C_2H_2$ or $C_4F_8$ gas as a source by RFCVD (power: 400 W).

Example 3

Production 2 of Semiconductor Device

A semiconductor device was produced by ArF liquid immersion lithography.

An interlayer insulating film 12 was formed on a silicon substrate 11, as illustrated in FIG. 2A, and a titanium film 13 was formed on the interlayer insulating film 12 by sputtering, as illustrated in FIG. 2B. Next, a resist pattern 14 was formed as illustrated in FIG. 2C by ArF liquid immersion lithography, and using the resist pattern 14 as a mask, the titanium film 13 was patterned by reactive ion to etching to form an opening 15a. Sequentially, as well as removing the resist pattern 14 by reactive ion etching, an opening 15b was formed in the interlayer insulating film 12 using the titanium film 13 as a mask, as illustrated in FIG. 2D.

Next, the titanium film 13 was removed by a wet treatment, and a TiN film 16 was formed on the interlayer insulating film 12 by sputtering as illustrated in FIG. 2E, followed by forming a Cu film 17 on the TiN film 16 by electroplating. Thereafter, as illustrated in FIG. 2F, the surface was flattened by chemical-mechanical planarization (CMP) so as to leave the barrier metal and the Cu film (first metal film) in the groove corresponded to the opening 15b (FIG. 2D) to thereby form a first layer wiring 17a.

Then, as illustrated in FIG. 2G, after forming an interlayer insulating film 18 on the first layer wiring 17a, as illustrated in FIG. 2H, a Cu plug (a second metal film) 19 for connecting the first layer wiring 17a with an upper layer wiring mentioned later, and a TiN film 16a were formed in the same manner illustrated in FIGS. 2A to 2F.

By repeating each steps, as illustrated in FIG. 2I, a semiconductor device having a multilayer-wiring structure including the first layer wiring 17a, the second layer wiring 20a and the third layer wiring 21a above the silicon substrate 11 was produced. Note that, in FIG. 2I, the barrier metal layer formed below each layer wiring is not illustrated.

In Example 3, the resist pattern 14 was a resist pattern formed by using the resist pattern improving material D of Example 1. Specifically, it was formed by applying the resist pattern improving material D to the resist pattern, which had been formed by the ArF liquid immersion lithography, followed by baking and rinsing with pure water to reduce the LWR value to thereby form the resist pattern 14.

Moreover, the interlayer insulating film 12 was a low dielectric film having a dielectric constant of 2.7 or lower. Examples of such layer include a microporous silica film (CERAMATE NCS, manufactured by JCG Catalysts and Chemicals Ltd., dielectric constant: 2.25), and a fluorocarbon film (dielectric constant: 2.4) deposited and formed with a mixed gas of $C_4F_8$ and $C_2H_2$ or $C_4F_8$ gas as a source by RFCVD (power: 400 W).

The disclosed resist pattern improving material is capable of improving the uniformity of the resist pattern width by reducing roughness of side walls of the resist pattern formed of an ArF resist, a resist for liquid immersion lithography, or the like; is suitably used for forming precise patterns exceeding the exposure limit of light for use; and is suitably used in various patterning method, production methods of semiconductor devices, and the like. The disclosed resist pattern improving material is particularly suitably used in the disclosed method for forming a resist pattern, and the disclosed method for producing a semiconductor device.

The disclosed method for producing a semiconductor device is suitably used for productions of various semiconductor devices such as flash memories, DRAMs, FRAMs, and the like.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the sprit and scope of the invention.

What is claimed is:

1. A method for forming a resist pattern, comprising:
    forming a resist pattern on a processing surface, and
        applying a resist pattern improving material so as to cover a surface of the resist pattern,
    wherein the forming a resist pattern on a processing surface, comprising:
        applying a resist pattern material so as to cover a processing surface, and
        exposing and developing so as to form the resist pattern,
    wherein the resist pattern improving material comprises:
    C8 linear alkanediol;
    water, and
    a water-soluble resin.
2. The method according to claim 1, further comprising:
    developing the resist pattern, whose surface is covered with the resist pattern improving material, with a developer containing water.
3. The method according to claim 1, further comprising:
    baking the resist pattern improving material, after the applying.
4. The method according to claim 1, wherein the linear alkanediol is a compound expressed by the following general formula 1:

General Formula 1

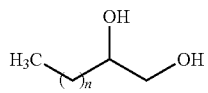

where n is 5.

* * * * *